United States Patent
Hiraide et al.

(10) Patent No.: US 7,895,492 B2
(45) Date of Patent: Feb. 22, 2011

(54) PSEUDORANDOM NUMBER GENERATOR, SEMICONDUCTOR INTEGRATED CIRCUIT, PSEUDORANDOM NUMBER GENERATOR CONTROL APPARATUS, PSEUDORANDOM NUMBER GENERATOR CONTROL METHOD, AND COMPUTER PRODUCT

(75) Inventors: Takahisa Hiraide, Kawasaki (JP); Tatsuru Matsuo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 268 days.

(21) Appl. No.: 12/073,553

(22) Filed: Mar. 6, 2008

(65) Prior Publication Data

US 2008/0222474 A1    Sep. 11, 2008

(30) Foreign Application Priority Data

Mar. 7, 2007    (JP) .............................. 2007-057790

(51) Int. Cl.
*G06F 11/263*    (2006.01)
*G06F 11/30*    (2006.01)

(52) U.S. Cl. ...................................... 714/739; 714/728

(58) Field of Classification Search ................... None
See application file for complete search history.

(56) References Cited

U.S. PATENT DOCUMENTS

2003/0229838 A1 *   12/2003   Hiraide ....................... 714/738

2005/0149804 A1 *   7/2005   Hiraide ....................... 714/738

FOREIGN PATENT DOCUMENTS

| JP | 2-214326 | 8/1990 |
|---|---|---|
| JP | 2002-236144 | 8/2002 |
| JP | 2003-518245 | 6/2003 |
| JP | 2006-78493 | 3/2006 |
| WO | 01/38890 A1 | 5/2001 |
| WO | 01/39254 | 5/2001 |

OTHER PUBLICATIONS

Office Action, mailed Apr. 14, 2009, in corresponding Japanese Patent Application No. 2007-057790 (5 pp. including translation).

* cited by examiner

*Primary Examiner*—Robert Beausoliel
*Assistant Examiner*—Dipakkumar Gandhi
(74) *Attorney, Agent, or Firm*—Fujitsu Patent Center

(57) ABSTRACT

In a linear feedback shift register (LFSR), a four-bit shift register mainly using F/Fs is formed and an XOR circuit that feeds back an exclusive OR of a first bit and a last bit to the first bit is also provided, thereby outputting a test pattern having a maximum cycle of 15. A phase change circuit that can perform arbitrary phase change of a test pattern based on input of a control signal having a maximum clock number 4 and an average clock number $\log_2 4$ is also formed in the LFSR. As a result, a smaller clock count is required for the LFSR to output a test pattern that matches a test pattern automatically generated by an ATPG.

16 Claims, 12 Drawing Sheets

FIG.7

| CONTROL SIGNAL | | OPERATION |
|---|---|---|
| 0xx | 000 | EXECUTE SHIFT OPERATION |
| | 001 | ADVANCE LFSR PHASE ONE STEP |
| | 010 | ADVANCE LFSR PHASE TWO STEPS |
| | 011 | ADVANCE LFSR PHASE FOUR STEPS |
| 1xx | 100 | SET INVERSION F/F OF I1 |
| | 101 | SET INVERSION F/F OF I2 |
| | 110 | SET INVERSION F/F OF I3 |
| | 111 | SET INVERSION F/F OF I4 |

PSEUDORANDOM NUMBER GENERATOR, SEMICONDUCTOR INTEGRATED CIRCUIT, PSEUDORANDOM NUMBER GENERATOR CONTROL APPARATUS, PSEUDORANDOM NUMBER GENERATOR CONTROL METHOD, AND COMPUTER PRODUCT

CROSS-REFERENCE TO RELATED APPLICATIONS

This application is based upon and claims the benefit of priority from the prior Japanese Patent Application No. 2007-057790, filed on Mar. 7, 2007, the entire contents of which are incorporated herein by reference.

BACKGROUND OF THE INVENTION

1. Field of the Invention

The present invention relates to a technology of a built-in self test (BIST) and a pseudorandom number generator.

2. Description of the Related Art

In recent years, as a test method for a semiconductor integrated circuit, a BIST using a pseudorandom number generator, such as a linear feedback shift register (LFSR) is utilized for the purpose of, for example, reducing test time.

FIG. 12 is a schematic of a circuit configuration of an LFSR according to a conventional technology. As shown in FIG. 12, an LFSR 1200 has a four-bit shift register mainly using flip-flops (F/F) formed therein. An XOR circuit that feeds back an exclusive OR of a first bit and a last bit to the first bit is also provided.

Like the LFSR 1200, the use of an n-bit shift register enables output of a test pattern having a maximum cycle of $2^n-1$. For example, as shown in FIG. 12, the LFSR 1200, being a four-bit shift register, enables output of a test pattern of 15 phases. As shown in FIG. 12, when seed values "1101" are set sequentially starting from the first bit in the shift register, the LFSR 1200 can output a test pattern "101100100011 . . . ".

FIG. 13 is a schematic of a circuit configuration of a circuit under test including an LFSR according to a conventional technology. As shown in FIG. 13, a circuit-under-test 1300 includes the LFSR 1200 depicted in FIG. 12, scan paths 1310, 1320, 1330, and 1340 formed of plural of F/Fs, and an output verifier, e.g., a multiple input signature register (MISR) 1350.

When a BIST is performed on the circuit-under-test 1300, an external control signal is first input to set seed values of the LFSR 1200. Based on the input of the external control signal, a control signal is supplied to the LFSR 1200 resulting in values of a test pattern output from the LFSR 1200 to be sequentially input into the first F/Fs in the respective scan paths 1310 to 1340. Subsequently, values stored in the F/Fs are output at each system clock, and output results from each of the scan paths 1310 to 1340 are compressed and stored in the MISR 1350.

Providing the LFSR 1200 in the circuit-under-test 1300 in this manner enables the BIST of the circuit-under-test 1300 to be performed using many test patterns. However, outputting test patterns from the LFSR 1200 that match test patterns having a high failure detection rate automatically generated from an automatic test pattern generator (ATPG) is a problem.

Thus, a test method of correcting each test pattern output from the LFSR based on the input of the external control signal or correcting the seed value of the LFSR to match each test pattern output from the LFSR with each test pattern having a high failure detection rate automatically generated by the ATPG (hereinafter, "ATPG pattern") has been disclosed (see, for example, Japanese Patent Application Laid-open No. 2002-236144 and Published Japanese Translation of PCT Application No. 2003-518245). According to such a test method, the BIST using test patterns having a high failure detection rate can be efficiently carried out in a short period of time without requiring a high-capacity memory to store a large number of test patterns.

However, in the technologies disclosed in Japanese Patent Application Laid-open No. 2002-236144 and Published Japanese Translation of PCT Application No. 2003-518245, since the factor of the time (clock count) is not considered, the time required to perform the test cannot be reduced in view of the time involved for the correction of the test patterns.

FIG. 14 is a schematic of a test pattern matching method according to a conventional technology. For example, as shown in FIG. 14, when an ATPG pattern is "10X1100X10 . . . ", (1) a seed value "1101" is set with respect to the LFSR. At this time, a clock count of 4 is required. As a result, a test pattern is temporarily determined as "101100100011110 . . . ". (2) Then, the LFSR is shifted for four bits that are matched with the ATPG pattern. At this time, a clock count of 4 is required.

(3) Subsequently, seed values "0001" are again set with respect to the LFSR. At this time, a clock count of 4 is required. (4) The LFSR is shifted for five bits that are matched with the ATPG pattern. At this time, a clock count of 5 is required. (5) A seed value "0 . . . " is again set with respect to the LFSR. At this time, a clock count of 4 is required. A clock count required for the processing (1) to (5) is 21.

When the seed value is again set with respect to the four-bit shift register in this manner, a control signal having at least a clock count of 4 is required. Therefore, the time required for testing cannot be reduced in view of the clock count involved in correction of the test pattern.

SUMMARY OF THE INVENTION

It is an object of the present invention to at least solve the above problems in the conventional technologies.

A pseudorandom number generator according to one aspect of the present invention includes a shift register that outputs a pseudorandom number of a plurality of bits; and a phase change circuit that changes, based on input of an external control signal, a phase for the pseudorandom number to be output by the shift register.

A semiconductor integrated circuit according to another aspect of the present invention includes a pseudorandom number generator that generates a test pattern, and includes a shift register that outputs a pseudorandom number of a plurality of bits and a phase change circuit that changes, based on input of an external control signal, a phase for the test pattern to be output by the shift register; and a circuit-under-test that receives the test pattern output by pseudorandom number generator.

A semiconductor integrated circuit according to still another aspect of the present invention includes a pseudorandom number generator that generates an indeterminate mask pattern, and includes a shift register that outputs a pseudorandom number of a plurality of bits, and a phase change circuit that changes, based on input of an external control signal, a phase for the indeterminate mask pattern to be output by the shift register. The semiconductor integrated circuit further includes a circuit-under-test; and an indeterminate mask unit that, using the indeterminate mask pattern output from the pseudorandom number generator, masks an indeterminate value in an output pattern output from the circuit-under-test.

A computer-readable recording medium according to yet another aspect of the present invention stores therein design data concerning a semiconductor integrated circuit that includes a pseudorandom number generator that generates a test pattern, and has a shift register that outputs a pseudorandom number of a plurality of bits and a phase change circuit that changes, based on input of an external control signal, a phase for the test pattern to be output by the shift register; and a circuit-under-test that receives the test pattern output by pseudorandom number generator.

A computer-readable recording medium according to still another aspect of the present invention stores therein design data concerning a semiconductor integrated circuit that includes a pseudorandom number generator that generates an indeterminate mask pattern, and has a shift register that outputs a pseudorandom number of a plurality of bits and a phase change circuit that changes, based on input of an external control signal, a phase for the indeterminate mask pattern to be output by the shift register; a circuit-under-test; and an indeterminate mask unit that, using the indeterminate mask pattern output from the pseudorandom number generator, masks an indeterminate value in an output pattern output from the circuit-under-test.

A pseudorandom number generator control method according to yet another aspect of the present invention is for a pseudorandom number generator that generates a test pattern, and includes a shift register that outputs a pseudorandom number of a plurality of bits and a phase change circuit that changes, based on input of an external control signal, a phase for the test pattern to be output by the shift register. The pseudorandom number generator control method includes acquiring a test pattern generated before phase change and an automatic test pattern generator (ATPG) pattern output from an ATPG; extracting the ATPG pattern, acquired at the acquiring, in units of blocks; retrieving, from the test pattern acquired at the acquiring and with respect to each block extracted at the extracting, a plurality of signals that match a plurality of signals included in a block extracted at the extracting; determining, based on the signals retrieved at the retrieving, a control signal to be output to the pseudorandom number generator; and outputting the control signal to the pseudorandom number generator.

A pseudorandom number generator control method according to still another aspect of the present invention is for a pseudorandom number generator that generates an indeterminate mask pattern, and includes a shift register that outputs a pseudorandom number of a plurality of bits and a phase change circuit that changes, based on input of an external control signal, a phase for the indeterminate mask pattern to be output by the shift register. The pseudorandom number generator control method includes acquiring an indeterminate mask pattern generated before phase change and an output test pattern output from a circuit-under-test; extracting the output test pattern, acquired at the acquiring, in units of blocks; retrieving, from the indeterminate mask pattern acquired at the acquiring and with respect to each block extracted at the extracting, a plurality of signals that match a plurality of signals included in a block extracted at the extracting; determining, based on the signals retrieved at the retrieving, a control signal to be output to the pseudorandom number generator; and outputting the control signal to the pseudorandom number generator.

A computer-readable recording medium according to yet another aspect of the present invention stores therein a pseudorandom number generator control computer-program for a pseudorandom number generator that generates a test pattern, and includes a shift register that outputs a pseudorandom number of a plurality of bits and a phase change circuit that changes, based on input of an external control signal, a phase for the test pattern to be output by the shift register, wherein the pseudorandom number generator control computer-program causes a computer to execute acquiring a test pattern generated before phase change and an automatic test pattern generator (ATPG) pattern output from an ATPG; extracting the ATPG pattern, acquired at the acquiring, in units of blocks; retrieving, from the test pattern acquired at the acquiring and with respect to each block extracted at the extracting, a plurality of signals that match a plurality of signals included in a block extracted at the extracting; determining, based on the signals retrieved at the retrieving, a control signal to be output to the pseudorandom number generator; and outputting the control signal to the pseudorandom number generator.

A computer-readable recording medium according to yet another aspect of the present invention stores therein a pseudorandom number generator control computer-program for a pseudorandom number generator that generates an indeterminate mask pattern, and includes a shift register that outputs a pseudorandom number of a plurality of bits and a phase change circuit that changes, based on input of an external control signal, a phase for the indeterminate mask pattern to be output by the shift register, wherein the pseudorandom number generator control computer-program causes a computer to execute acquiring an indeterminate mask pattern generated before phase change and an output test pattern output from a circuit-under-test; extracting the output test pattern, acquired at the acquiring, in units of blocks; retrieving, from the indeterminate mask pattern acquired at the acquiring and with respect to each block extracted at the extracting, a plurality of signals that match a plurality of signals included in a block extracted at the extracting; determining, based on the signals retrieved at the retrieving, a control signal to be output to the pseudorandom number generator; and outputting the control signal to the pseudorandom number generator.

A pseudorandom number generator control apparatus according to still another aspect of the present invention is for a pseudorandom number generator that generates a test pattern, and includes a shift register that outputs a pseudorandom number of a plurality of bits and a phase change circuit that changes, based on input of an external control signal, a phase for the test pattern to be output by the shift register. The pseudorandom number generator control apparatus includes an acquiring unit that acquires a test pattern generated before phase change and an automatic test pattern generator (ATPG) pattern output from an ATPG; an extracting unit that extracts the ATPG pattern, acquired by the acquiring unit, in units of blocks; a retrieving unit that retrieves, from the test pattern acquired by the acquiring unit and with respect to each block extracted by the extracting unit, a plurality of signals that match a plurality of signals included in a block extracted by the extracting unit; a determining unit that determines, based on the signals retrieved by the retrieving unit, a control signal to be output to the pseudorandom number generator; and an output unit that outputs the control signal to the pseudorandom number generator.

A pseudorandom number generator control apparatus according to yet another aspect of the present invention is for a pseudorandom number generator that generates an indeterminate mask pattern, and includes a shift register that outputs a pseudorandom number of a plurality of bits and a phase change circuit that changes, based on input of an external control signal, a phase for the indeterminate mask pattern to be output by the shift register. The pseudorandom number generator control apparatus includes an acquiring unit that acquires an indeterminate mask pattern generated before phase change and an output test pattern output from a circuit-under-test; an extracting unit that extracts the output test pattern, acquired by the acquiring unit, in units of blocks; a retrieving unit that retrieves, from the indeterminate mask pattern acquired by the acquiring unit and with respect to each block extracted at by the extracting unit, a plurality of signals that match a plurality of signals included in a block extracted by the extracting unit; a determining unit that determines, based on the signals retrieved by the retrieving unit, a control signal to be output to the pseudorandom number generator; and an output unit that outputs the control signal to the pseudorandom number generator.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 7 is a schematic of an example of control signals used in the semiconductor integrated circuit according to the third embodiment;

DETAILED DESCRIPTION OF THE PREFERRED EMBODIMENTS

Referring to the accompanying drawings, exemplary embodiments according to the present invention are explained in detail below.

Figure 1:
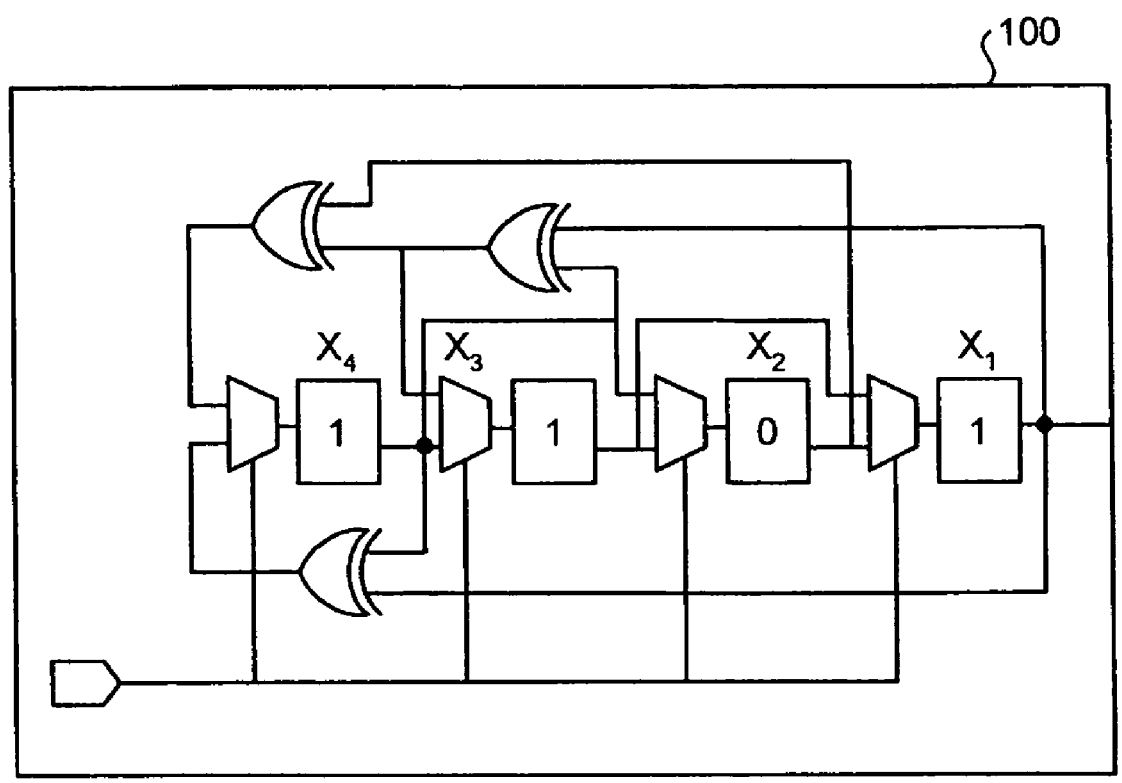
FIG. 1 is a schematic of a circuit configuration of an LFSR according to a first embodiment of the present invention.

FIG. 1 is a schematic of a circuit configuration of an LFSR according to a first embodiment of the present invention. As shown in FIG. 1, a four-bit shift register mainly using F/Fs ($X_1$ to $X_4$) is formed in an LFSR 100. An XOR circuit that feeds back an exclusive OR of a first bit ($X_4$) and a last bit ($X_1$) to the first bit ($X_4$) is provided, thereby outputting a test pattern of a maximum of 15 phases.

In the LFSR 100, a phase change circuit is formed that is mainly formed of an XOR circuit and a multiplexer and in the output of a test pattern from the shift register (hereinafter, "test pattern"), can change, e.g., advance, a given phase for the test pattern. For simplicity, a part of the phase change circuit is omitted in FIG. 1.

Upon receiving a control signal having a clock count of 1, the phase change circuit can advance the phase by "$1(2^0)$", "$2(2^1)$", "$4(2^2)$", or "$8(2^3)$" phases according to the control signal.

A method of determining the phase change performed by the phase change circuit is explained. For example, like the LFSR 100 depicted in FIG. 1, in the phase change circuit including F/Fs ($X_1$ to $X_4$) and corresponding to four bits, when values of the F/Fs are set to X ($X_1$, $X_2$, $X_3$, and $X_4$), a circuit that performs z advances with respect to a given phase is determined by the following expressions (1) to (3).

$$X = \begin{pmatrix} X_1 \\ X_2 \\ X_3 \\ X_4 \end{pmatrix} \quad (1)$$

$$C = \begin{pmatrix} 0100 \\ 0010 \\ 0001 \\ 1001 \end{pmatrix} \quad (2)$$

$$X(z) = C^z \cdot X \quad (3)$$

For example, a circuit that advances a phase "2" steps is represented by the following expression (4).

$$X(2) = \begin{pmatrix} 0010 \\ 0001 \\ 1001 \\ 1101 \end{pmatrix} \cdot \begin{pmatrix} X_1 \\ X_2 \\ X_3 \\ X_4 \end{pmatrix} \quad (4)$$

For example, {0,0,1,0} in the first row is indicative of a circuit that sets a value of the F/F (X3) with respect to the F/F ($X_1$). {0,0,0,1} in the second row is indicative of a circuit that sets a value of the F/F ($X_4$) with respect to the F/F ($X_2$). {1,0,0,1} in the third row is indicative of a circuit that sets an exclusive OR of the F/F ($X_1$) and the F/F (X4) with respect to the F/F (X3). {1,1,0,1} in the fourth row is indicative of a circuit that sets an exclusive OR of the F/F ($X_1$), the F/F ($X_2$), and the F/F ($X_4$) with respect to the F/F ($X_4$).

In the phase change circuit, for example, as shown in FIG. 1, when seed values "1101" are set sequentially starting from the first bit of the shift register, the LFSR 100 can output a test pattern "101100100011 . . . ". However, if a test pattern automatically generated from the ATPG is "1100100011 . . . ", no matching is achieved between the two respective test patterns.

Thus, when a control signal indicating that a phase is advanced by "$2(2^1)$" steps is input to the phase change circuit, a phase of the test pattern output from the LFSR can be advanced by "$2(2^1)$" steps, thereby outputting the test pattern "1100100011 . . . ". As a result, the test patterns can be matched with each other.

For example, when advancing a phase of the test pattern by "15" steps, control signals having a clock count of only 4 (a control signal indicative of advancing the phase by "1" step, a control signal indicative of advancing the phase by "2" steps, a control signal indicative of advancing the phase by "4" steps, and a control signal indicative of advancing the phase by "8" steps) to the phase change circuit can be input. For example, when advancing the phase for the test pattern by "8" steps, a control signal having a clock count of only 1 (a control signal indicative of advancing the phase by "8" steps) to the phase change circuit can be input.

Figure 2:
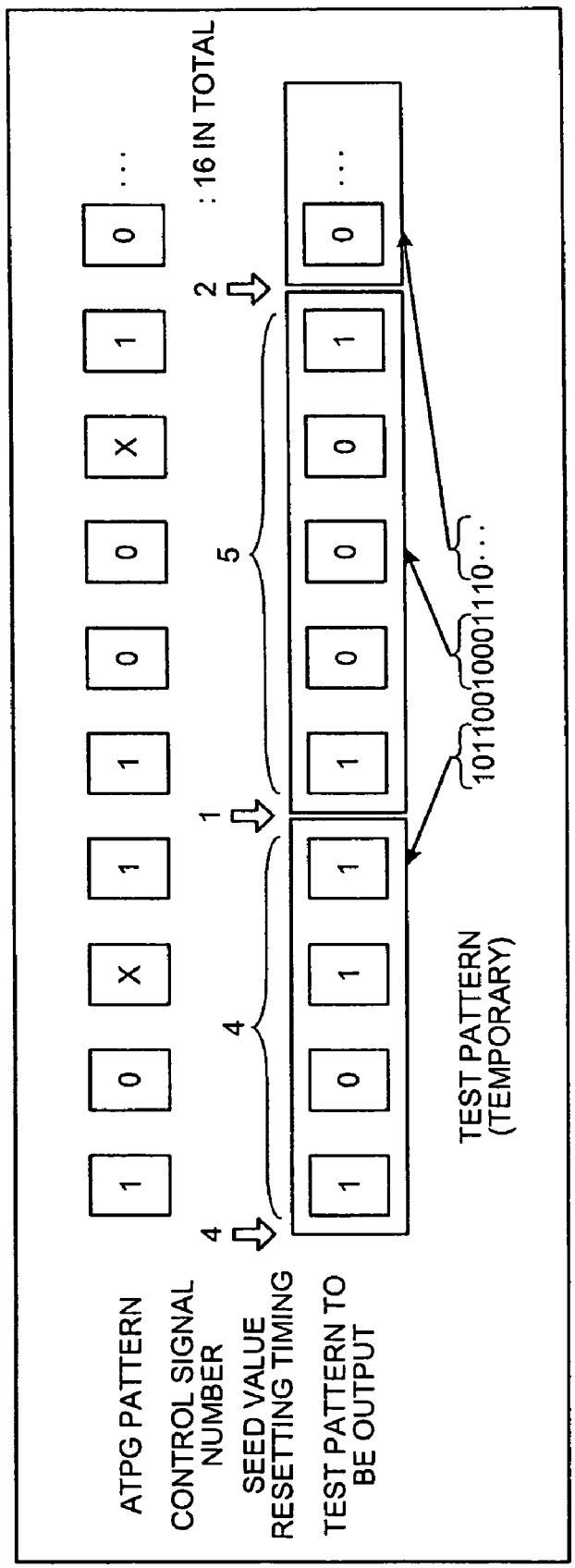
FIG. 2 is a schematic of a test pattern matching method by the LFSR according to the first embodiment.

FIG. 2 is a schematic of a test pattern matching method by the LFSR according to the first embodiment. For example, as shown in FIG. 2, when the ATPG pattern is "10X1100X10 . . . ", (1) seed values "1101" are set with respect to the LFSR. A clock count of 4 is required in the example. As a result, a test pattern is temporarily determined as "101100100011110 . . . ". (2) Then, the LFSR is shifted for four bits that match the ATPG pattern. At this time, a clock count of 4 is required.

(3) Subsequently, for the set values of the LFSR to become "0001", a phase for the test pattern to be output from the LFSR is advanced by "2" steps by inputting a control signal indicating such to the LFSR. At this time, a clock count of 1 is required. (4) Then, the LFSR is shifted for five bits matched the ATPG pattern. At this time, a clock count of 5 is required.

Figure 14:
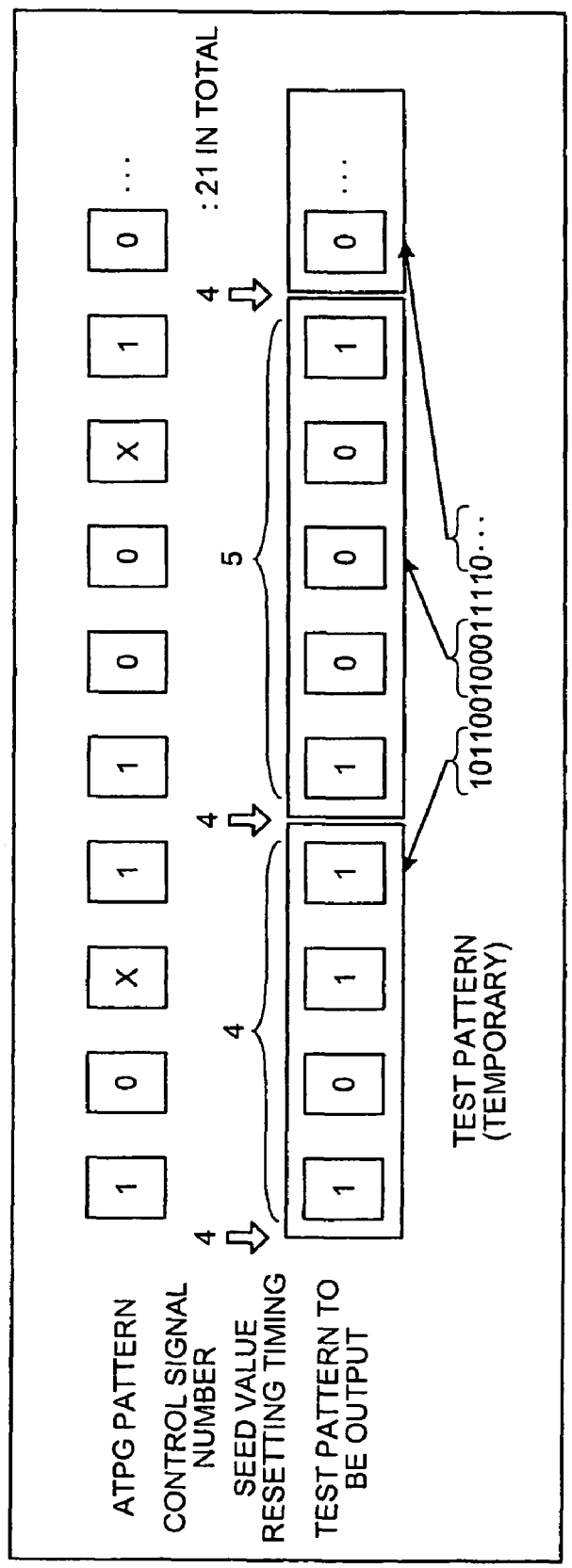
FIG. 14 is a schematic of a test pattern matching method according to a conventional technology.

(5) A phase for the test pattern to be output from the LFSR is advanced "3" times by inputting a control signal indicating such to the LFSR such that the set value of the LFSR becomes "0 . . . ". At this time, a clock count of 2 is required. The clock number required in the processing (1) to (5) is 16. In this manner, the same processing can be executed with a signal count that is "5" less than that in the conventional test pattern matching method, i.e., a method of seed value resetting requiring clock counts of 4) explained with reference to FIG. 14.

As explained above, the LFSR 100 according to the first embodiment includes the phase change circuit that can perform arbitrary phase advances for a test pattern output from the four-bit shift register based on the input of the control signal having a maximum clock count of 4 and an average clock count log$_2$4, thereby outputting a test pattern that matches the ATPG pattern using a smaller clock count. When the LFSR 100 is built in a circuit under test, a BIST using a test pattern having a high failure detection rate can be performed more efficiently in a short time without requiring a high-capacity memory to store a large number of test patterns.

Figure 3:
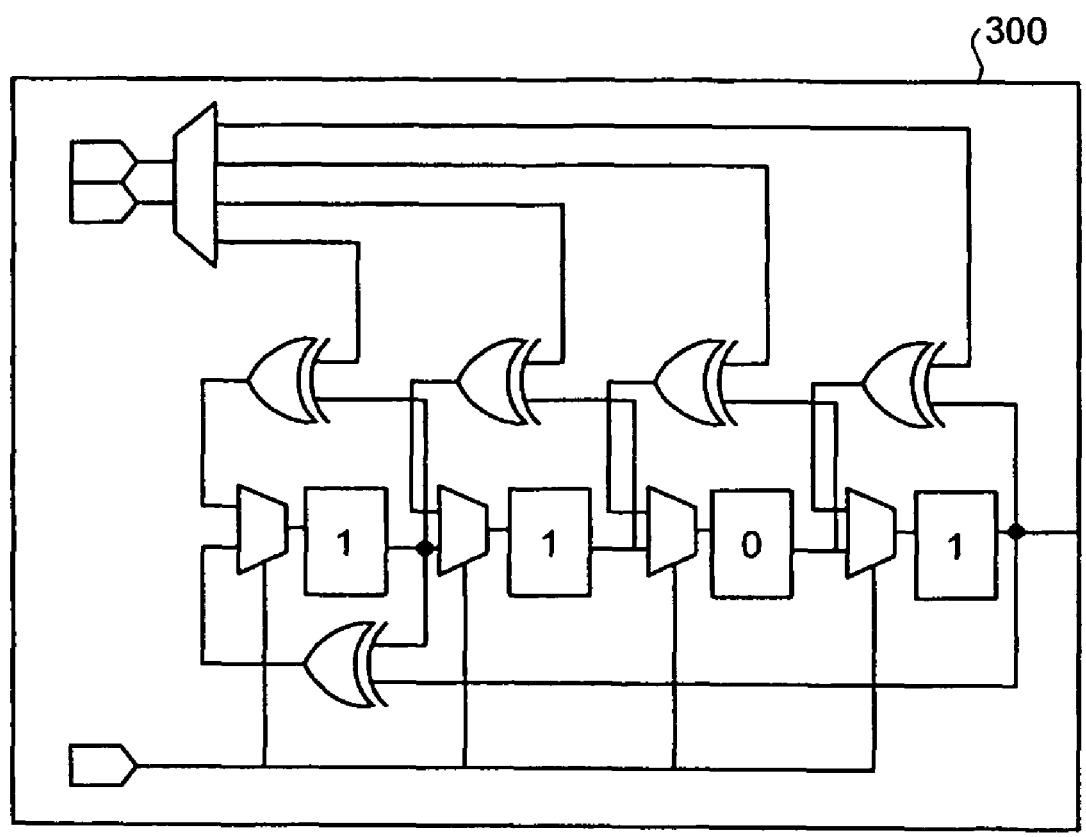
FIG. 3 is a schematic of a circuit configuration of an LFSR according to a second embodiment of the present invention.

FIG. 3 is a schematic of a circuit configuration of an LFSR according to a second embodiment of the present invention. As shown in FIG. 3, like the LFSR 100, a four-bit shift register mainly using F/Fs is formed in an LFSR 300 and an XOR circuit that feeds back an exclusive OR of a first bit and a last bit to the first bit is provided, thereby outputting a test pattern of a maximum of 15 phases.

In the LFSR 300, like the LFSR 100, a phase change circuit is formed that is mainly formed of the XOR circuit and a multiplexer, and can arbitrarily change phases for the test pattern by using an external control signal.

Here, the phase change circuit formed in the LFSR 300 receives one control signal and inverses values of bits associated with the control signal, thereby arbitrarily changing the phase for a test pattern.

For example, as shown in FIG. 3, when seed values "1101" are set sequentially starting from the first bit of the shift register, the LFSR 300 can output a test pattern "101100100011 . . . ". However, if an ATPG pattern is "1100100011 . . . ", the patterns do not match.

Thus, when control signals indicating that the first bit, the second bit, and the third bit are inverted (three control signals in total) are input to the phase change circuit and the seed values of the shift register are changed to "0011", a phase for the test pattern output from the LFSR 300 is advanced by "2" steps, thereby outputting a test pattern "1100100011 . . . ". As a result, the patterns can be matched with each other.

The LFSR 300 according to the second embodiment includes the phase change circuit that can perform arbitrary phase change for a test pattern output from the four-bit shift register by inverting arbitrary bit values based on input of the control signal having a maximum clock count of 4 and an average clock count log$_2$4. Therefore, the LFSR 300 can output a test pattern that matches the ATPG pattern with a smaller clock count and a smaller circuit overhead. When the LFSR 300 is built in a circuit under test, a BIST using a test pattern having a high failure detection rate can be executed more efficiently in a short period of time without requiring a high-capacity memory to store a large number of test patterns.

Figure 4:
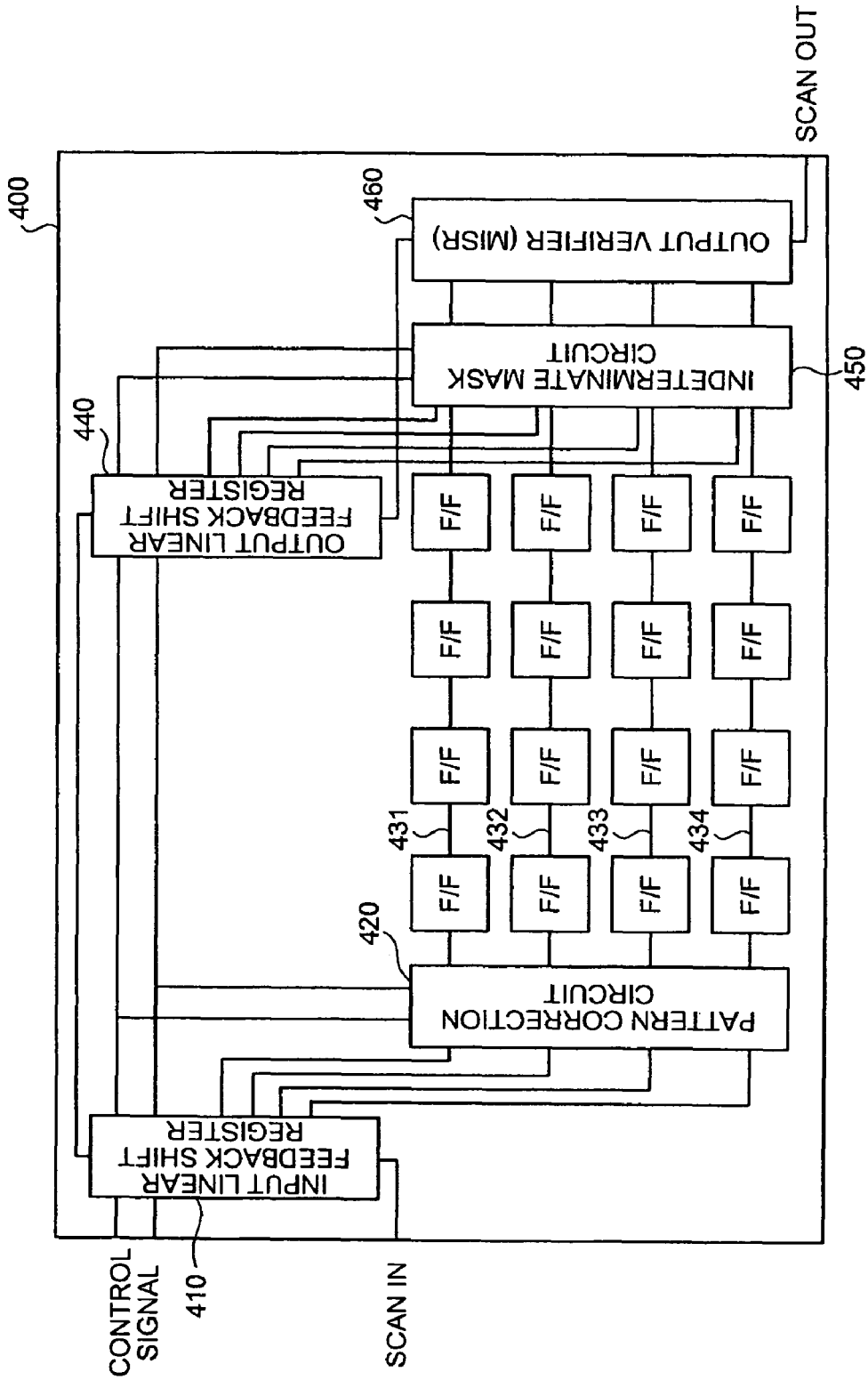
FIGS. 4, 5, and 6 are schematics of circuit configurations of a semiconductor integrated circuit according to a third embodiment.
Figure 5:
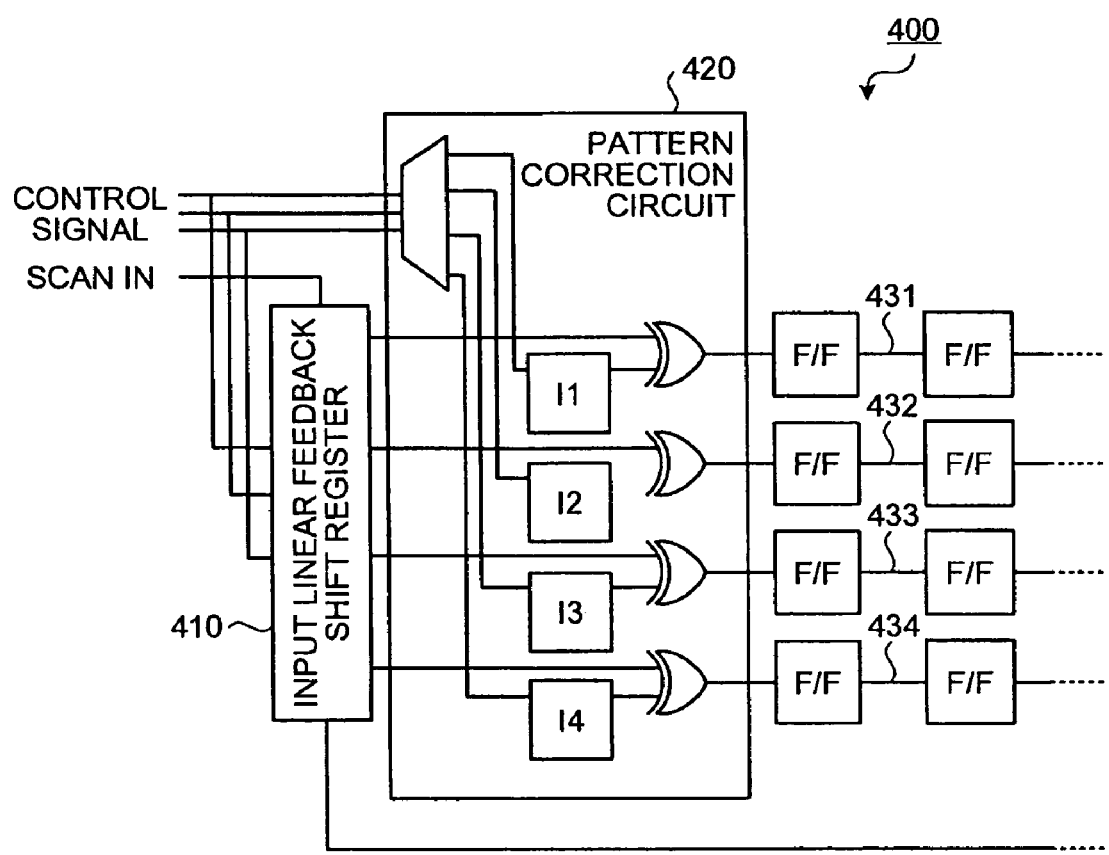
Figure 6:
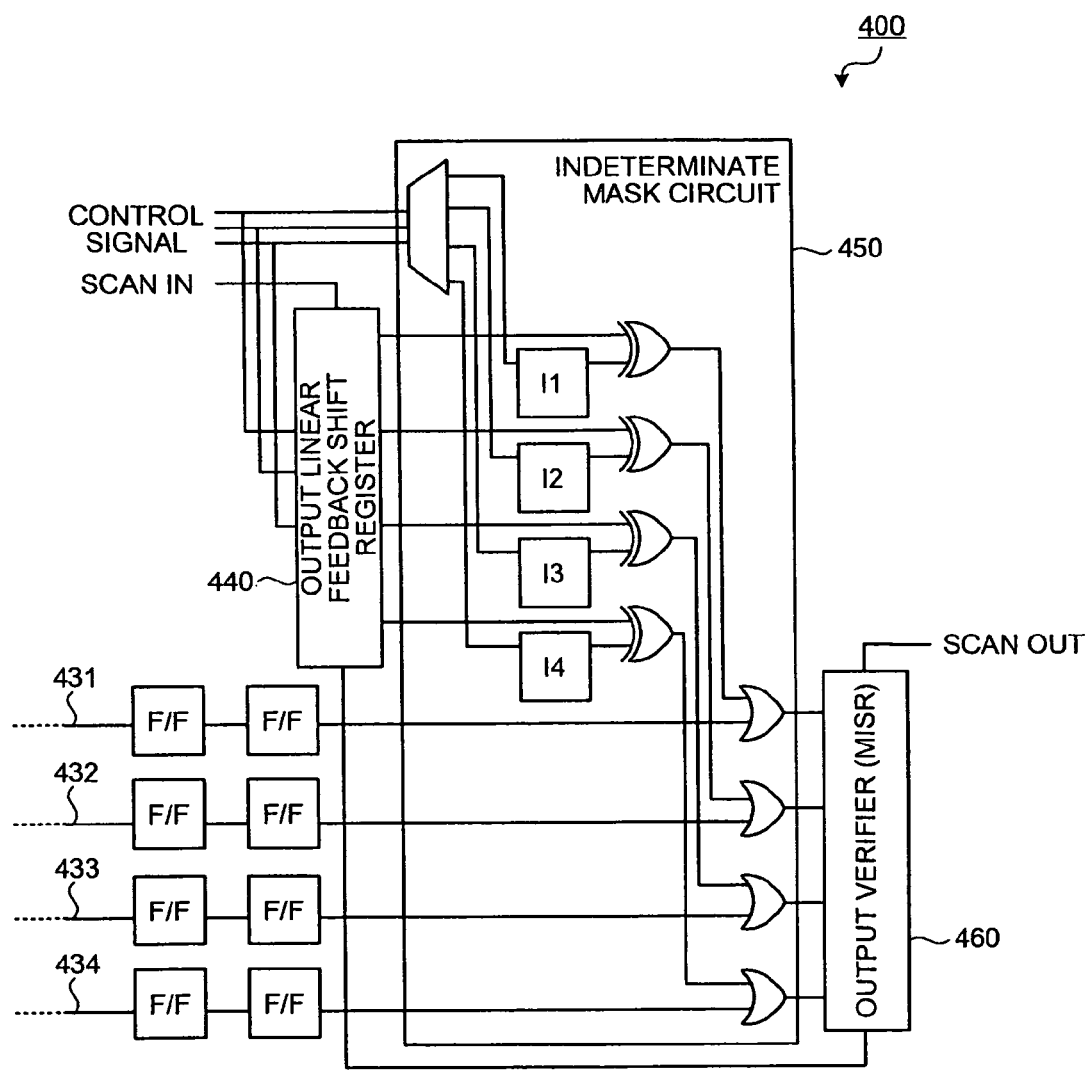

FIGS. 4, 5, and 6 are schematics of circuit configurations of a semiconductor integrated circuit according to a third embodiment. As shown in FIGS. 4, 5, and 6, a circuit-under-test 400 includes an input LFSR 410, a pattern correction circuit 420, scan paths 431, 432, 433, and 434 formed of plural F/Fs, an output LFSR 440, an indeterminate mask circuit 450, and an output verifier (MISR) 460.

The input LFSR 410, like the LFSR depicted in FIG. 1 or 3, includes a four-bit shift register and a phase change circuit that changes a test pattern output from the shift register to thereby generate a test pattern. As the input LFSR 410 has the above-explained structure, the input LFSR 410 can arbitrarily change a phase for a test pattern to be generated based on input of a control signal from an LFSR control apparatus 800 that is explained hereinafter with reference to FIG. 8.

The pattern correction circuit 420 is formed of, for example, an XOR circuit that inverts a test pattern output from the input LFSR 410 based on input of a control signal from the LFSR control apparatus 800. As a result, the pattern correction circuit 420 corrects the test pattern output from the input LFSR 410 based on input of the control signal from the LFSR control apparatus 800 and then inputs the corrected test pattern into the first F/F in each of the scan paths 431 to 434.

The output LFSR 440, like the LFSR depicted in FIG. 1 or 3, includes, for example, a four-bit shift register and a phase change circuit that changes a test pattern output from the shift register. As a result, the output LFSR 440 generates a pseudorandom pattern (hereinafter, "indeterminate mask pattern") that masks an indeterminate value output from each of the scan paths 431 to 434 as much as possible. As the output LFSR 440 has the above-explained structure, the output LFSR 440 can arbitrarily change the phase for an indeterminate mask pattern to be generated based on input of a control signal from the LFSR control apparatus 800.

The indeterminate mask circuit 450 includes, for example, an XOR circuit that inverts an indeterminate mask pattern output from the output LFSR 440 based on the input of a control signal from the LFSR control apparatus 800 or an OR circuit that uses the indeterminate mask pattern output from the output LFSR 440 to mask an indeterminate value included in an output pattern output from each of the scan paths 431 to 434 (hereinafter, "test result pattern"). As a result, the indeterminate mask circuit 450 corrects the indeterminate mask pattern output from the output LFSR 440 based on the control signal from the LFSR control apparatus 800, and then uses the corrected indeterminate mask pattern to change an indeterminate value output from each of the scan paths 431 to 434 to a predetermined fixed value, namely, mask the indeterminate value. Output results that include the masked indeterminate value and are supplied from the scan paths 431 and 434 are compressed and stored in the MISR 460.

FIG. 7 is a schematic of an example of control signals used in the semiconductor integrated circuit according to the third embodiment. As shown in FIG. 7, a control signal "0xx" is a control signal input to the input LFSR 410 or the output LFSR 440, while a control signal "1xx" is a control signal input to the pattern correction circuit 420 or the indeterminate mask circuit 450.

Such control signals are determined by LFSR control processing executed by the LFSR control apparatus 800, and output from the LFSR control apparatus 800. Based on each control signal, a test pattern from the input LFSR 410 or an indeterminate mask pattern from the output LFSR 440 is corrected by the input LFSR 410, the pattern correction circuit 420, the output LFSR 440, and the indeterminate mask circuit 450 respectively receiving the control signal.

As a result, the test pattern from the input LFSR 410 can be matched with an ATPG pattern, or the indeterminate mask pattern from the output LFSR 440 can be matched with a test result pattern from each of the scan paths 431 to 434. A procedure of the LFSR control processing executed by the LFSR control apparatus 800 is explained hereinafter with reference to FIG. 10.

Figure 8:
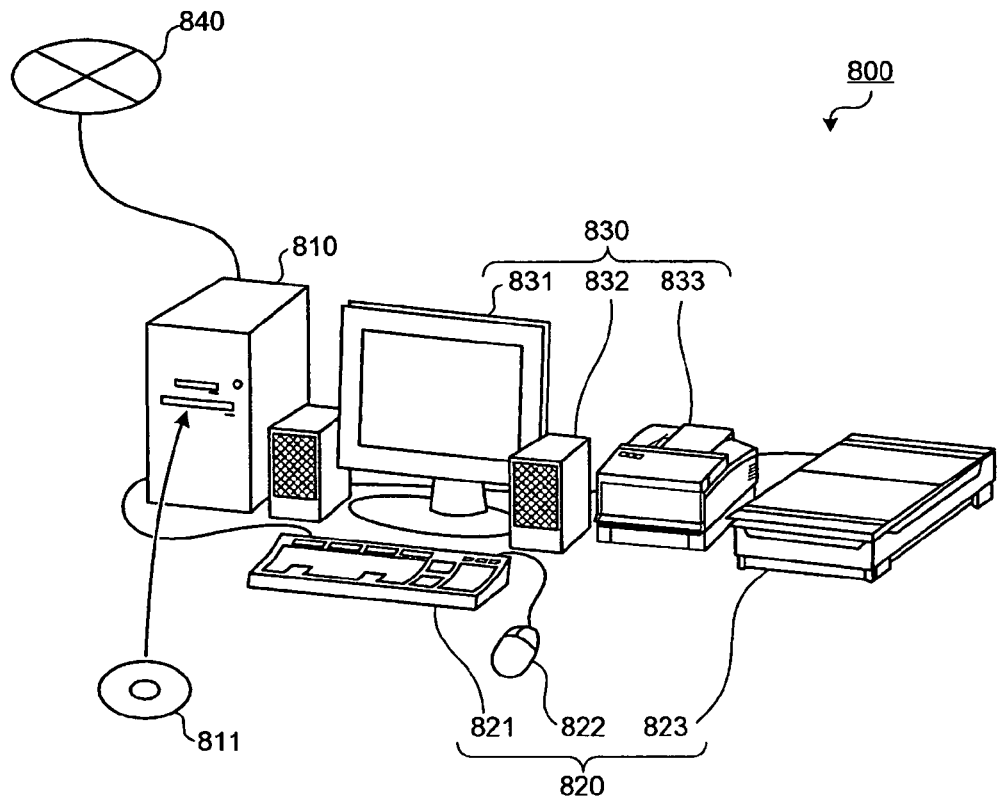
FIG. 8 is a schematic of a hardware configuration of an LFSR control apparatus according to the third embodiment.

FIG. 8 is a schematic of a hardware configuration of the LFSR control apparatus according to the third embodiment. As shown in FIG. 8, the LFSR control apparatus 800 includes, for example, a computer 810, an input device 820, and an output device 830, and can be connected with a network 840, e.g., an LAN, a WAN, or the Internet through a non-depicted router or modem.

The computer 810 includes a CPU, a memory, and an interface. The CPU controls the entire LFSR control apparatus 800. The memory is formed of, for example, a read-only memory (ROM), a random access memory (RAM), a hard disk (HD), an optical disk 811, and a flash memory. The memory is used as a work area for the CPU.

The memory stores various kinds of programs that are loaded in response to a command from the CPU. A disk drive controls the reading/writing of data from/into the HD and the optical disk 811. The optical disk 811 and the flash memory are attachable to/detachable from the computer 810. The interface controls input from the input device 820, output to the output device 830, and transmission/reception with respect to the network 840.

As the input device 820, there are a keyboard 821, a mouse 822, a scanner 823, and others. The keyboard 821 includes keys for inputting characters, numerical figures, various instructions, etc., and data is input through the keyboard 821. The keyboard 821 may be of a touch panel type. The mouse 822 performs, for example, movement of a cursor, selection of a range, movement of and size change of a window, etc. The scanner 823 optically reads an image. The read image is retrieved as image data, and stored in the memory in the computer 810. The scanner 823 may have an optical character recognition (OCR) function.

As the output device 830, there are a display 831, a speaker 832, a printer 833, and others. The display 831 displays a cursor, an icon, and a toolbox as well as data, such as, text, an image, or function information. The speaker 832 outputs sound, e.g., sound effects and reading voice. The printer 833 prints image data and/or text data.

Figure 9:
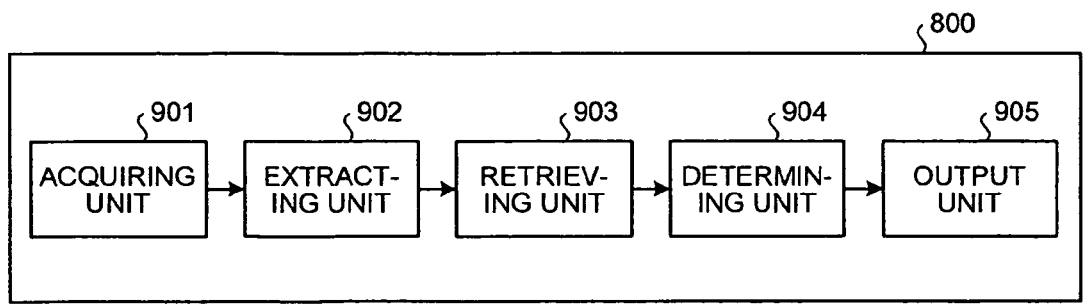
FIG. 9 is a functional diagram of the LFSR control apparatus.

FIG. 9 is a functional diagram of the LFSR control apparatus 800. As shown in FIG. 9, the LFSR control apparatus 800 includes an acquiring unit 901, an extracting unit 902, a retrieving unit 903, a determining unit 904, and an output unit 905.

The acquiring unit 901 acquires a test pattern(s) generated, before phase change, by the input LFSR 410 and an ATPG pattern output from an ATPG, or a test pattern(s) generated, before phase change, by the output LFSR 440 and a test result pattern output from each of the scan paths 431 to 434. Specifically, the acquiring unit 901 reads each of the patterns from a recording medium, such as the memory explained above. The patterns may be generated by the LFSR control apparatus 800 or may be generated by a different apparatus.

The acquiring unit 901 may acquire each of the patterns from a separate apparatus connected with the LFSR control apparatus 800. Specifically, the acquiring unit 901 realizes the function thereto by, for example, the interface of the computer 810.

The extracting unit 902 extracts blocks of the ATPG pattern or test result patterns acquired by the acquiring unit 901. For example, the extracting unit 902 blocks the acquired ATPG pattern or test result patterns within a range such that a specified number is not exceeded.

For example, when a bit number of the F/F in the input LFSR 410 or the output LFSR 440 is four bits, the extracting unit 902 determines the specified number as "4". The extracting unit 902 forms a block of the ATPG pattern or the test result patterns in such a manner that the bit count of the bits in which "0" or "1" is set (i.e., the bit count excluding bit values of "X") does not exceed "4".

Specifically, the extracting unit 902 realizes the function thereto when, for example, the CPU executes a program stored in the memory of the computer 810. Data extracted by the extracting unit 902 is temporarily recorded in, for example, the memory of the computer 810.

The retrieving unit 903, for each block, retrieves signals that approximates (or coincides with) signals included in a block extracted by the extracting unit 902 from the before-phase-change test patterns acquired by the acquiring unit 901 and generated by the input LFSR 410 or the output LFSR 440.

Here, the retrieving unit 903 retrieves a test pattern that has the least number of bits not matching an ATPG pattern (or a test result pattern) and also has the least amount of phase change performed by the input LFSR 410 (or the output LFSR 440). When the extracting unit 902 forms a block of the ATPG pattern or the test result patterns, the retrieving unit 903 performs the retrieval processing with respect to each block.

Specifically, the retrieving unit 903 realizes the function thereto when, for example, the CPU executes a program stored in the memory of the computer 810. Data retrieved by the retrieving unit 903 is temporarily stored in, for example, the memory of the computer 810.

The determining unit 904 determines, based on the signals retrieved by the retrieving unit 903, a control signal to be output to the input LFSR 410 (or the output LFSR 440) from among the control signals depicted in FIG. 7. Specifically, the determining unit 904 realizes the function thereto when, for example, the CPU executes a program stored in the memory of the computer 810. Data determined by the determining unit 904 is temporarily recorded in, for example, the memory of the computer 810.

The output unit 905 outputs the control signal determined by the determining unit 904 to the input LFSR 410 and the pattern correction circuit 420 (or the output LFSR 440 and the indeterminate mask circuit 450). For example, when the extracting unit 902 forms blocks of the ATPG test pattern (or the test result patterns), the output unit 905 executes the output processing with respect to each block. Specifically, the output unit 905 realizes the function thereto by, for example, by the interface of the computer 810.

Figure 10:
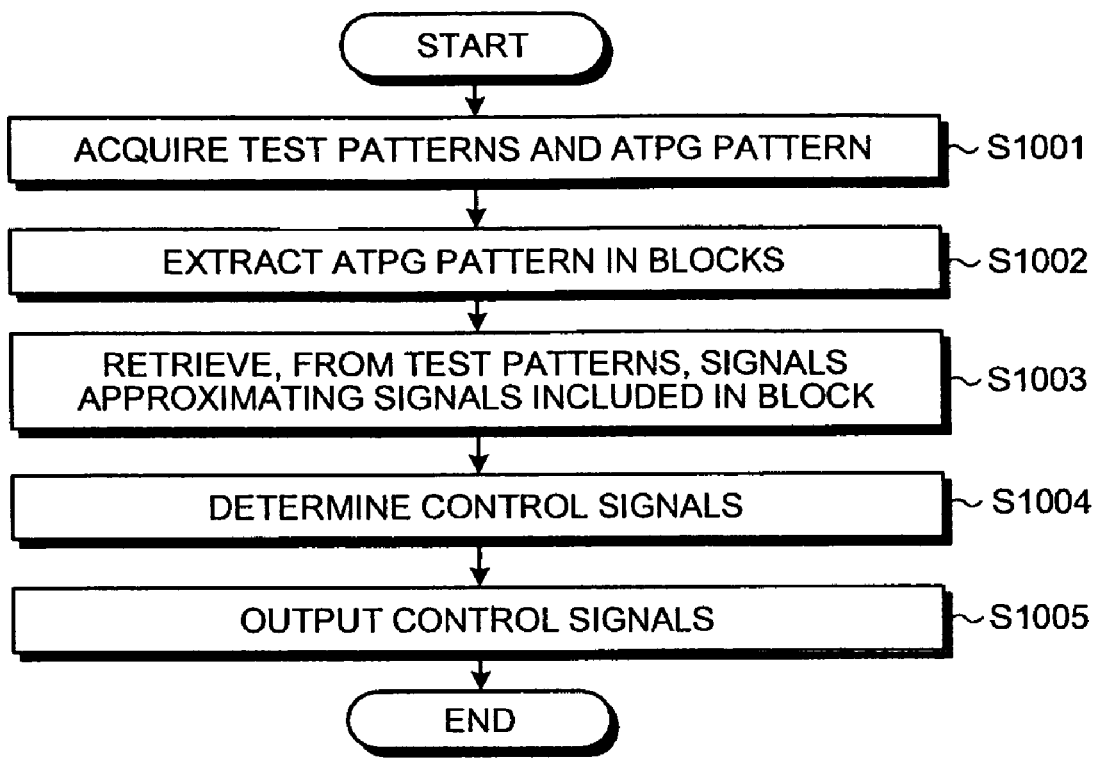
FIG. 10 is a flowchart of an example of LFSR control processing executed by the LFSR control apparatus.

FIG. 10 is a flowchart of an example of LFSR control processing executed by the LFSR control apparatus 800. Although an example of LFSR control processing with respect to the input LFSR 410 and the pattern correction circuit 420 is explained, the same processing procedure can be applied to the LFSR control processing with respect to the output LFSR 440 and the indeterminate mask circuit 450.

First, the acquiring unit 901 acquires before-phase-change test patterns generated by the input LFSR 410 and a ATPG pattern output from the ATPG (step S1001), and the extracting unit 902 extracts the ATPG pattern acquired at step S1001 in units of blocks (step S1002).

The retrieving unit 903 retrieves, for each block, signals that approximates (or coincides with) signals included in a block extracted at step S1002 from the test patterns acquired at step S1001 (step S1003), and the determining unit 904 determines control signals to be output to the input LFSR 410 and the pattern correction circuit 420 based on the signals retrieved at step S1003 (step S1004).

The output unit 905 outputs the control signals determined at step S1004 to the input LFSR 410 and the pattern correction circuit 420 (step S1005), thereby terminating a series of processing.

According to such processing, the control signal output from the LFSR control apparatus 800 for the input LFSR 410 and the pattern correction circuit 420 is first input into the input LFSR 410. As a result, the input LFSR 410 corrects the test patterns and outputs the test patterns approximating the ATPG pattern.

Then, when the control signal is input to the pattern correction circuit 420, the pattern correction circuit 420 corrects (inverts) only signals in the test patterns output from the input LFSR 410 having a value different from the test pattern output from the ATPG, and the corrected test pattern (i.e., a test pattern that matches the ATPG pattern) is input to each of the scan paths 431 to 434.

In LFSR control processing with respect to the output LFSR 440 and the indeterminate mask circuit 450, a control signal output from the LFSR control apparatus 800 for the output LFSR 440 and the indeterminate mask circuit 450 is first input to the output LFSR 440. As a result, the output LFSR 440 corrects each indeterminate mask pattern, and the output LFSR 440 outputs the indeterminate mask pattern that approximates a test result pattern.

Then, when the control signal is input to the indeterminate mask circuit 450, the indeterminate mask circuit 450 corrects (inverts) signals in the test patterns output from the output LFSR 440 having a value different from the test result pattern, thereby effecting indeterminate value mask processing based on the corrected test pattern (i.e., an indeterminate mask pattern that matches the test result pattern).

Figure 11:
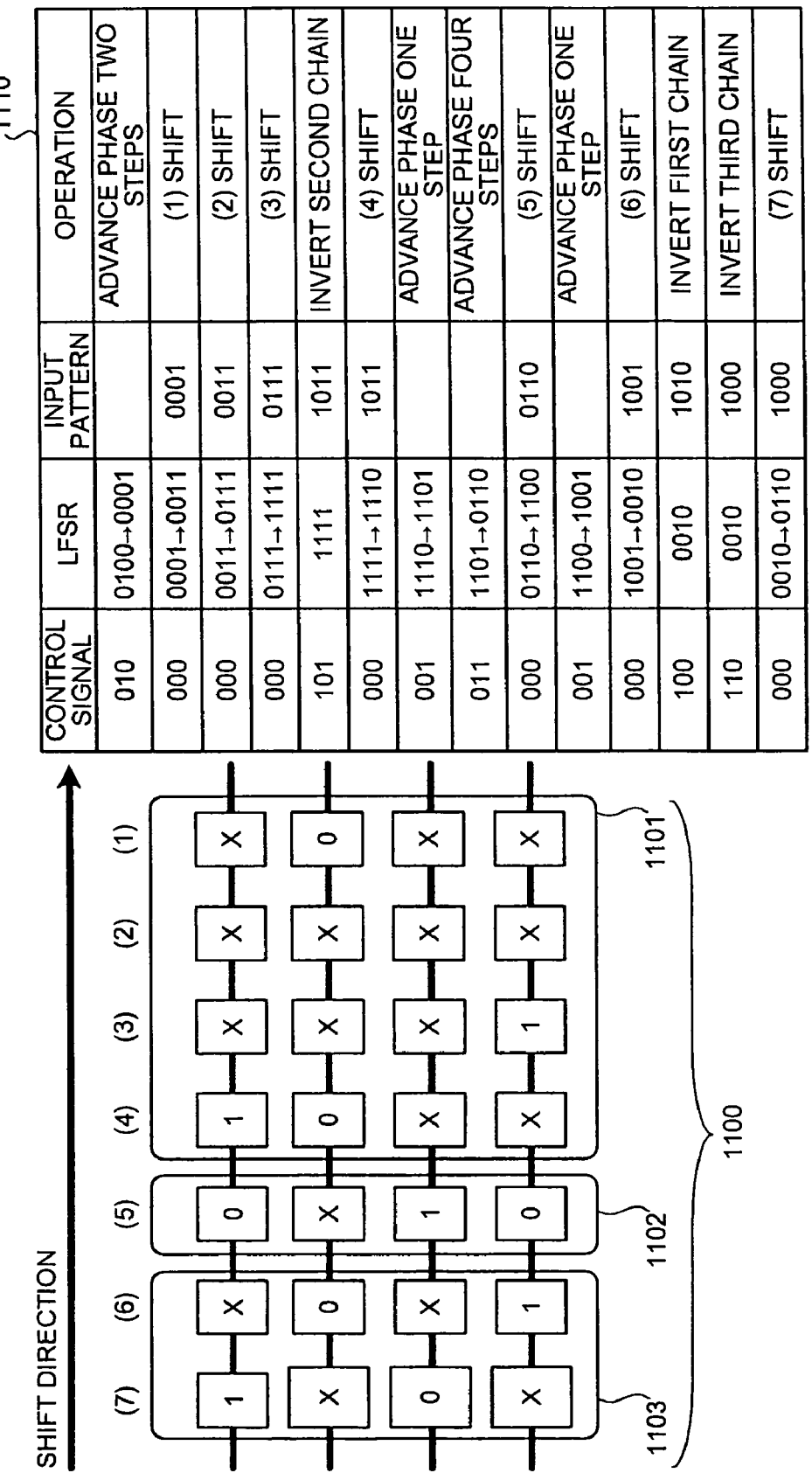
FIG. 11 is a schematic of an example of control signals output from the LFSR control apparatus.
Figure 12:
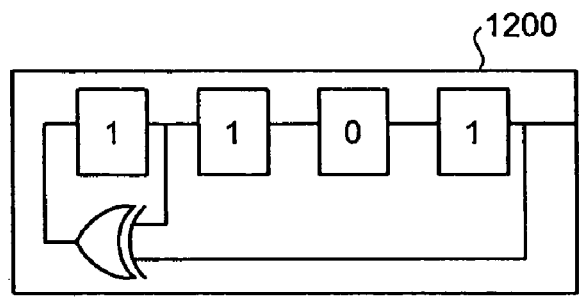
FIG. 12 is a schematic of a circuit configuration of an LFSR according to a conventional technology.
Figure 13:
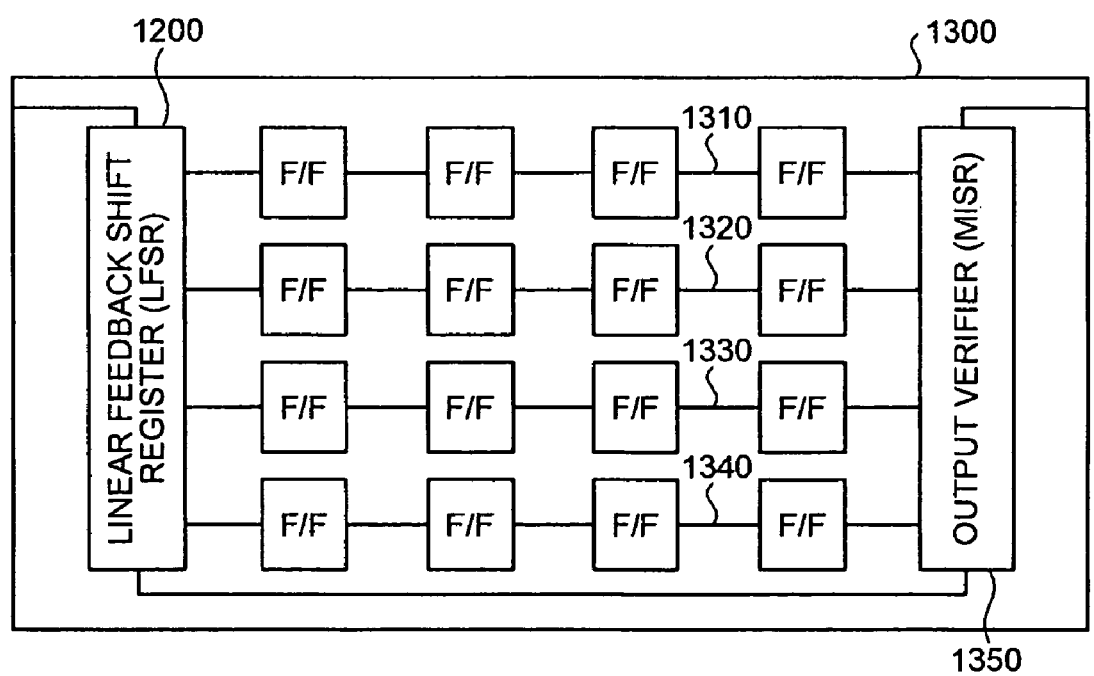
FIG. 13 is a schematic of a circuit configuration of a circuit under test that includes an LFSR according to a conventional technology.

FIG. 11 is a schematic of an example of control signals output from the LFSR control apparatus 800. An ATPG pattern 1100 depicted in FIG. 11 is acquired by the acquiring unit 901 and divided into blocks 1101, 1102, and 1103 by the extracting unit 902.

Here, each of the blocks 1101 to 1103 is formed in columnar units such that a bit count of bits where "0" or "1" is set (i.e., the bit count excluding bit values of "X") does not exceed a specified number "4" (i.e., the bit count of the input LFSR 410).

For example, the bit count excluding bit values of "X" in the block 1101 that includes columns (1) to (4) is "4", the bit count excluding bit values of "X" in the block 1102 that includes column (5) is "3", and the bit count excluding bit values of "X" in the block 1103 that includes columns (6) and (7) is "4".

In regard to such an ATPG pattern 1100, the LFSR control apparatus 800 searches test patterns output from the input LFSR 410 for a test pattern providing the least number of bits that do not match the ATPG pattern 1100 and the least amount of phase change with respect to the input LFSR 410 based on a current set value.

For example, the LFSR control apparatus 800 retrieves "0001001101111011" as a test pattern with respect to the block 1101. The LFSR control apparatus 800 also retrieves "0110" as a test pattern with respect to the block 1102 and further retrieves "10011000" as a test pattern with respect to the block 1102.

The LFSR control apparatus 800 determines control signals in such a manner that test patterns output from the input LFSR 410 become the retrieved test patterns. For example, when a current set value of the input LFSR 410 is "0100", test patterns output from the input LFSR 410 are as depicted in Table 1110 of FIG. 11. Here, when the same control signals are continuously determined, the LFSR control apparatus 800 may subject the control signals to run-length compression.

As explained above, the semiconductor integrated circuit (circuit-under-test 400) according to the third embodiment of the present invention performs arbitrary phase change of a test pattern and then inverts a signal different from an ATPG pattern at a low cost under control of the LFSR control apparatus 800. As a result, the time required to correct the test pattern can be reduced, and the time required for a BIST by the circuit-under-test 400 can be thereby decreased.

The semiconductor integrated circuit (circuit-under-test 400) according to the third embodiment performs phase change of an indeterminate mask pattern and then inverts a signal different from a test result pattern at a low cost (clock number). As a result, the time required to correct the indeterminate mask pattern can be reduced, and the time required for a BIST of the circuit-under-test 400 can be thereby decreased.

The LFSR control method explained in the embodiments can be implemented by a computer such as a personal computer and a workstation executing a program that is prepared in advance. The program is recorded on a computer-readable recording medium such as a hard disk, a flexible disk, a CD-ROM, an MO, and a DVD, and is executed by being read out from the recording medium by a computer. The program can be a transmission medium that can be distributed through a network such as the Internet.

A recording medium storing therein design data concerning the circuit-under-test 400 explained in the embodiment may be prepared. Here, the design data concerning the circuit-under-test 400 is computer-readable electronic data expressing the circuit-under-test 400 by a register transfer level (RTL) description written in a hardware description language (HDL) or a net list after logic synthesis. When such design data is developed in a computer apparatus having a test tool installed therein, a simulation test and others can be executed before manufacture.

When such design data is processed such that it can be written in a programmable logic device (PLD), e.g., a field programmable gate array (FPGA) and then downloaded to the PLD, the circuit-under-test 400 can be manufactured.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A pseudorandom number generator comprising:
   a shift register that outputs a pseudorandom number of a plurality of bits; and a phase change circuit that changes, based on input of a control signal, a phase for the pseudorandom number to be output by the shift register, wherein the phase change circuit changes the phase by generating seed values to be provided to the shift register after a plurality of clocks subsequent to an output of the pseudorandom number, and inputting the seed values to the shift register.

2. The pseudorandom number generator according to claim 1, wherein the phase change circuit performs $2^i-1$ phase changes based on input of the control signal having a clock count i, where i (i=1 to n) is a bit count of the shift register.

3. The pseudorandom number generator according to claim 1, wherein the phase change circuit changes the phase by $2^n$ at each clock, where n is a positive integer.

4. A semiconductor integrated circuit comprising:
a pseudorandom number generator that generates a test pattern, and includes:
a shift register that outputs a pseudorandom number of a plurality of bits, and
a phase change circuit that changes, based on input of a control signal, a phase for the
test pattern to be output by the shift register; and
a circuit-under-test that receives the test pattern output by the pseudorandom number generator, wherein
the phase change circuit changes the phase by generating seed values to be provided to the shift register after a plurality of clocks subsequent to an output of the pseudorandom number, and inputting the seed values to the shift register.

5. The semiconductor integrated circuit according to claim 4, further comprising:
a test pattern corrector that corrects, based on input of an external control signal, the test pattern output from the pseudorandom number generator, wherein
the circuit-under-test receives the test pattern corrected by the test pattern corrector.

6. A semiconductor integrated circuit comprising:
a pseudorandom number generator that generates an indeterminate mask pattern, and includes:
a shift register that outputs a pseudorandom number of a plurality of bits, and
a phase change circuit that changes, based on input of a control signal, a phase for the indeterminate mask pattern to be output by the shift register;
a circuit-under-test; and
an indeterminate mask unit that, using the indeterminate mask pattern output from the pseudorandom number generator, masks an indeterminate value in an output pattern output from the circuit-under-test, wherein
the phase change circuit changes the phase by generating seed values to be provided to the shift register after a plurality of clocks subsequent to an output of the pseudorandom number, and inputting the seed values to the shift register.

7. The semiconductor integrated circuit according to claim 6, wherein the indeterminate mask unit
includes an indeterminate mask pattern corrector that corrects, based on input of an external control signal, the indeterminate mask pattern output by the pseudorandom number generator, and
masks, using the indeterminate mask pattern corrected by the test pattern corrector, the indeterminate value in the output pattern output from the circuit-under-test.

8. A pseudorandom number generator control method for a pseudorandom number generator that generates a test pattern and includes a shift register that outputs a pseudorandom number of a plurality of bits and a phase change circuit that changes, based on input of a control signal, a phase for the test pattern to be output by the shift register, the pseudorandom number generator control method comprising:
acquiring a test pattern generated before phase change and an automatic test pattern generator (ATPG) pattern output from an ATPG;
extracting the ATPG pattern, acquired at the acquiring, in units of blocks;
retrieving, from the test pattern acquired at the acquiring and with respect to each block extracted at the extracting, a plurality of signals that match a plurality of signals included in a block extracted at the extracting;
determining, based on the signals retrieved at the retrieving, the control signal to be output to the pseudorandom number generator; and
outputting the control signal to the pseudorandom number generator, wherein
the control signal causes the phase change circuit to change the phase by generating seed values to be provided to the shift register after a plurality of clocks subsequent to an output of the pseudorandom number, and inputting the seed values to the shift register.

9. A pseudorandom number generator control method for a pseudorandom number generator that generates an indeterminate mask pattern and includes a shift register that outputs a pseudorandom number of a plurality of bits and a phase change circuit that changes, based on input of a control signal, a phase for the indeterminate mask pattern to be output by the shift register, the pseudorandom number generator control method comprising:
acquiring an indeterminate mask pattern generated before phase change and an output test pattern output from a circuit-under-test;
extracting the output test pattern, acquired at the acquiring, in units of blocks;
retrieving, from the indeterminate mask pattern acquired at the acquiring and with respect to each block extracted at the extracting, a plurality of signals that match a plurality of signals included in a block extracted at the extracting;
determining, based on the signals retrieved at the retrieving, the control signal to be output to the pseudorandom number generator; and
outputting the control signal to the pseudorandom number generator, wherein
the control signal causes the phase change circuit to change the phase by generating seed values to be provided to the shift register after a plurality of clocks subsequent to an output of the pseudorandom number, and inputting the seed values to the shift register.

10. The pseudorandom number generator control method according to claim 9, wherein
the extracting the output test pattern acquired at the acquiring includes extracting the blocks such that a bit count of definitive values included in a block does not exceed a bit count of the shift register.

11. A non-transitory computer-readable recording medium storing therein a pseudorandom number generator control computer-program for a pseudorandom number generator that generates a test pattern and includes a shift register that outputs a pseudorandom number of a plurality of bits and a phase change circuit that changes, based on input of a control signal, a phase for the test pattern to be output by the shift register, wherein the pseudorandom number generator control computer-program causes a computer to execute:

acquiring a test pattern generated before phase change and an automatic test pattern generator (ATPG) pattern output from an ATPG;

extracting the ATPG pattern, acquired at the acquiring, in units of blocks;

retrieving, from the test pattern acquired at the acquiring and with respect to each block extracted at the extracting, a plurality of signals that match a plurality of signals included in a block extracted at the extracting;

determining, based on the signals retrieved at the retrieving, the control signal to be output to the pseudorandom number generator; and outputting the control signal to the pseudorandom number generator, and wherein the control signal causes the phase change circuit to change the phase by generating seed values to be provided to the shift register after a plurality of clocks subsequent to an output of the pseudorandom number, and inputting the seed values to the shift register.

12. A non-transitory computer-readable recording medium storing therein a pseudorandom number generator control computer-program for a pseudorandom number generator that generates an indeterminate mask pattern and includes a shift register that outputs a pseudorandom number of a plurality of bits and a phase change circuit that changes, based on input of a control signal, a phase for the indeterminate mask pattern to be output by the shift register, wherein the pseudorandom number generator control computer-program causes a computer to execute:

acquiring an indeterminate mask pattern generated before phase change and an output test pattern output from a circuit-under-test;

extracting the output test pattern, acquired at the acquiring, in units of blocks;

retrieving, from the indeterminate mask pattern acquired at the acquiring and with respect to each block extracted at the extracting, a plurality of signals that match a plurality of signals included in a block extracted at the extracting;

determining, based on the signals retrieved at the retrieving, the control signal to be output to the pseudorandom number generator; and outputting the control signal to the pseudorandom number generator, and wherein the control signal causing the phase change circuit to change the phase by generating seed values to be provided to the shift register after a plurality of clocks subsequent to an output of the pseudorandom number, and inputting the seed values to the shift register.

13. The computer-readable recording medium according to claim 12, wherein the extracting the output test pattern acquired at the acquiring includes extracting the blocks such that a bit count of definitive values included in a block does not exceed a bit count of the shift register.

14. A pseudorandom number generator control apparatus for a pseudorandom number generator that generates a test pattern and includes a shift register that outputs a pseudorandom number of a plurality of bits and a phase change circuit that changes, based on input of a control signal, a phase for the test pattern to be output by the shift register, the pseudorandom number generator control apparatus comprising:

an acquiring unit that acquires a test pattern generated before phase change and an automatic test pattern generator (ATPG) pattern output from an ATPG;

an extracting unit that extracts the ATPG pattern, acquired by the acquiring unit, in units of blocks;

a retrieving unit that retrieves, from the test pattern acquired by the acquiring unit and with respect to each block extracted by the extracting unit, a plurality of signals that match a plurality of signals included in a block extracted by the extracting unit;

a determining unit that determines, based on the signals retrieved by the retrieving unit, the control signal to be output to the pseudorandom number generator; and an output unit that outputs the control signal to the pseudorandom number generator, wherein the control signal causes the phase change circuit to change the phase by generating seed values to be provided to the shift register after a plurality of clocks subsequent to an output of the pseudorandom number, and inputting the seed values to the shift register.

15. A pseudorandom number generator control apparatus for a pseudorandom number generator that generates an indeterminate mask pattern and includes a shift register that outputs a pseudorandom number of a plurality of bits and a phase change circuit that changes, based on input of a control signal, a phase for the indeterminate mask pattern to be output by the shift register, the pseudorandom number generator control apparatus comprising:

an acquiring unit that acquires an indeterminate mask pattern generated before phase change and an output test pattern output from a circuit-under-test;

an extracting unit that extracts the output test pattern, acquired by the acquiring unit, in units of blocks;

a retrieving unit that retrieves, from the indeterminate mask pattern acquired by the acquiring unit and with respect to each block extracted at by the extracting unit, a plurality of signals that match a plurality of signals included in a block extracted by the extracting unit;

a determining unit that determines, based on the signals retrieved by the retrieving unit, the control signal to be output to the pseudorandom number generator; and an output unit that outputs the control signal to the pseudorandom number generator, wherein the control signal causes the phase change circuit to change the phase by generating seed values to be provided to the shift register after a plurality of clocks subsequent to an output of the pseudorandom number, and inputting the seed values to the shift register.

16. The pseudorandom number generator control apparatus according to claim 15, wherein the extracting unit extracts the blocks such that a bit count of definitive values included in a block does not exceed a bit count of the shift register.

* * * * *